(12) United States Patent
Gregory et al.

(10) Patent No.: US 7,154,279 B2
(45) Date of Patent: Dec. 26, 2006

(54) PARTIAL DISCHARGE DETECTION TEST LINK, PARTIAL DISCHARGE DETECTION SYSTEM AND METHODS FOR DETECTING PARTIAL DISCHARGE ON A POWER CABLE

(75) Inventors: Brian Gregory, Dartford (GB); Andrew Leslie Barclay, Bexley (GB)

(73) Assignee: Pirelli Cables (2000) Limited, London (GB)

( * ) Notice: Subject to any disclaimer, the term of this patent is extended or adjusted under 35 U.S.C. 154(b) by 0 days.

(21) Appl. No.: 11/182,904

(22) Filed: Jul. 18, 2005

(65) Prior Publication Data

US 2005/0264298 A1 Dec. 1, 2005

Related U.S. Application Data

(62) Division of application No. 10/169,808, filed on Mar. 17, 2003, now Pat. No. 6,930,491.

(30) Foreign Application Priority Data

Jan. 27, 2000 (GB) ................................ 0001923.2

(51) Int. Cl.
G01R 31/12 (2006.01)
(52) U.S. Cl. ...................... 324/536; 324/544
(58) Field of Classification Search ................ 324/536, 324/544

See application file for complete search history.

(56) References Cited

U.S. PATENT DOCUMENTS 5,323,117 A * 6/1994 Endoh et al. ............... 324/551
5,471,144 A * 11/1995 Meyer ......................... 324/551
6,242,900 B1 6/2001 Fawcett et al.
6,313,640 B1 * 11/2001 Nasrallah et al. ............ 324/536
6,392,401 B1 * 5/2002 Cooke ......................... 324/127

FOREIGN PATENT DOCUMENTS

| JP | 04183219 | 6/1992 |
| JP | 08-005701 | 1/1996 |
| JP | 11-133099 | 5/1999 |

* cited by examiner

Primary Examiner—Walter Besnon
(74) Attorney, Agent, or Firm—Finnegan, Henderson, Farabow, Garrett & Dunner, L.L.P.

(57) ABSTRACT

A partial discharge detection test link and system is disclosed to detect partial discharge of a power cable accessory. The power cable accessory includes a first accessory component and a second accessory component connected to each other. The partial discharge detection test link is a permanent or temporary substitute for a conventional service link, connects directly across the power cable accessory and includes a conductor member and a partial discharge sensor. The conductor member has an electrically conductive element and an insulation surrounding and extending along the electrically conductive element. The electrically conductive element is electrically connected directly between the first and second accessory components. The partial discharge sensor is disposed about the conductor member and has the electrically conductive element as a primary winding and a secondary winding with the insulation positioned between the primary and secondary windings.

26 Claims, 6 Drawing Sheets

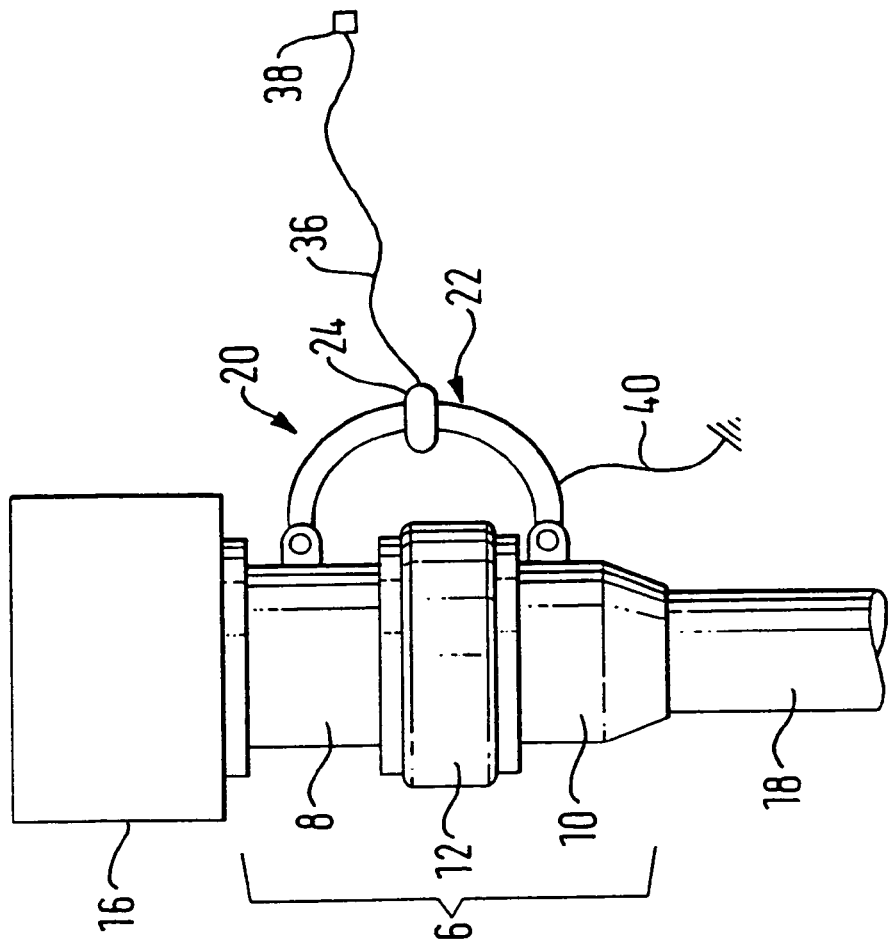
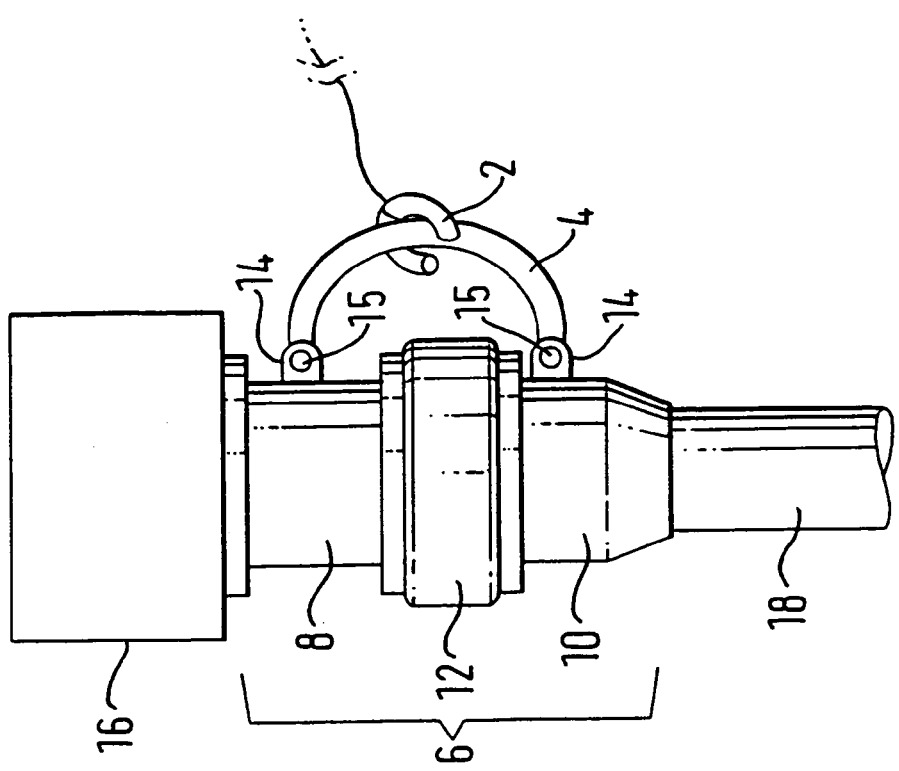

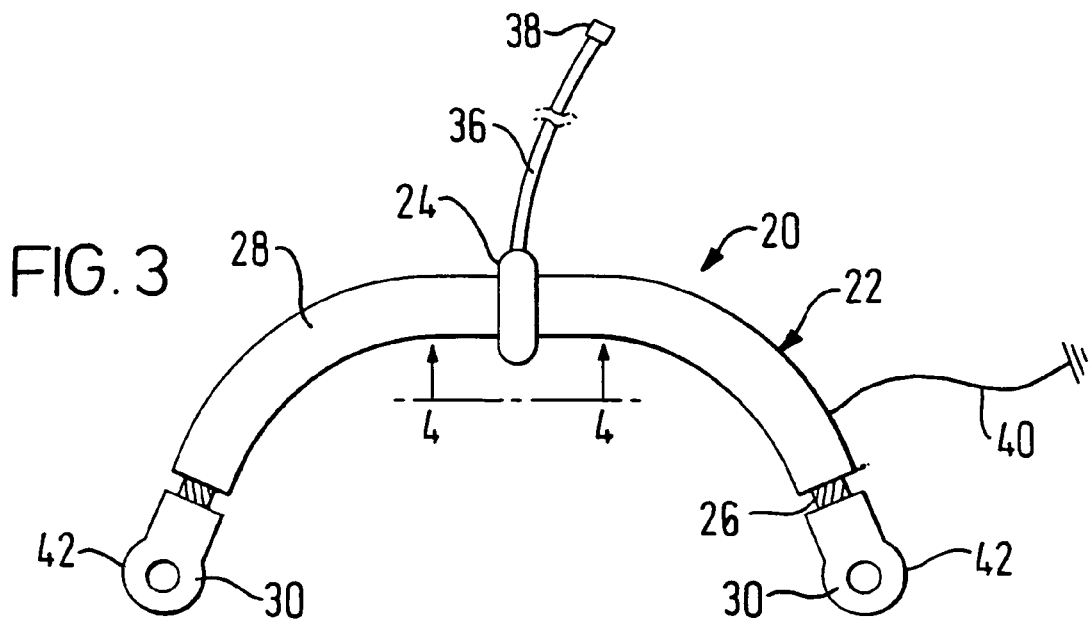
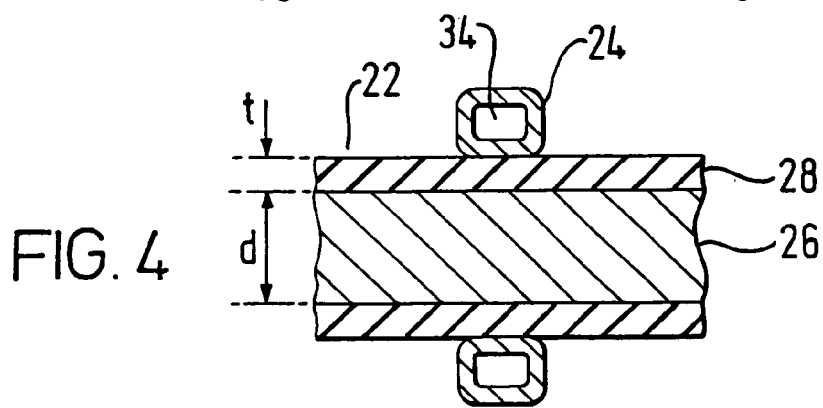
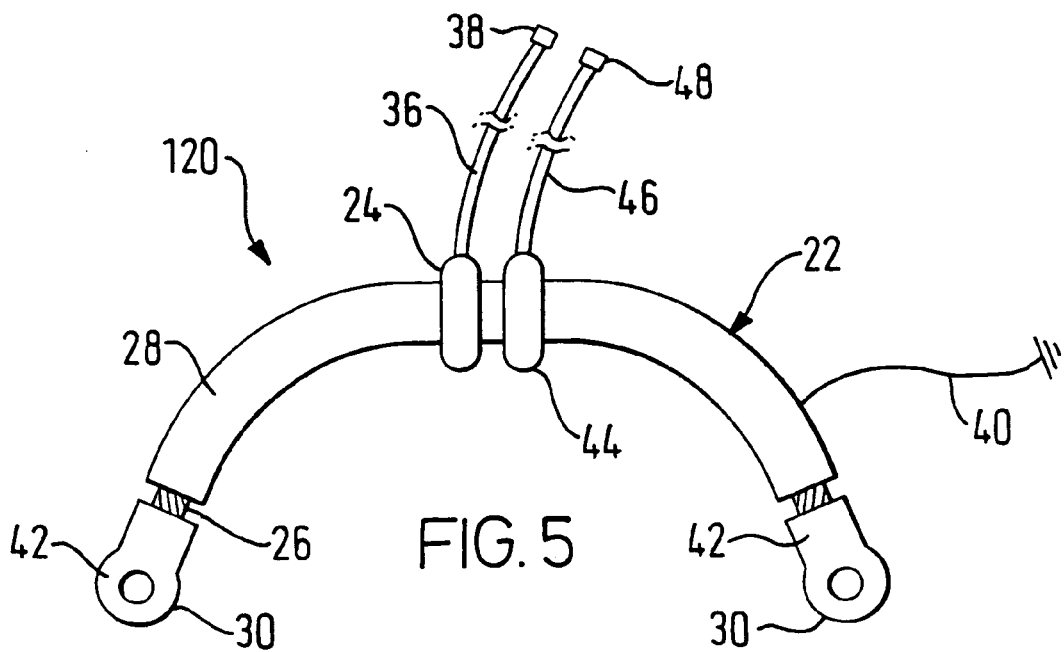

PARTIAL DISCHARGE DETECTION TEST LINK, PARTIAL DISCHARGE DETECTION SYSTEM AND METHODS FOR DETECTING PARTIAL DISCHARGE ON A POWER CABLE

This is a division of application Ser. No. 10/169,808, filed Mar. 17, 2003, now U.S. Pat. No. 6,930,491 which claims priority to PCT/GB01/00321, filed Jan. 26, 2001, and further claims priority to United Kingdom Application No. 0001923.2, filed Jan. 27, 2000, all of which are incorporated herein by reference.

BACKGROUND

The invention relates to apparatuses and methods for detecting partial discharge on a power cable. The apparatuses and the methods are particularly useful for detecting partial discharge on installed high-voltage power cables. More particularly, the apparatuses relate to a partial discharge detection test link and a partial discharge detection system.

For satisfactory long-term performance extruded dielectric power cable systems at stress levels used in modern extra-high-voltage cross-linked polyethylene (XLPE) cable systems, it is necessary to maintain high purity levels of material and precision of manufacture. If not, one or more latent defects may occur within the dielectric. For quality assurance, the cables themselves as well as the accessory components are rigorously tested electrically prior to installation. However, defects can subsequently be introduced. Such defects include external damage to cables or contamination thereof as well as mishandling or misalignment of accessory components, particularly during installation.

Latent defects of this type can be detected by conducting a post installation electrical test. One such test, considered most sensitive and revealing, measures partial discharge (PD) of the field-installed accessories. This test energizes the power cable system with alternating voltage, at or near power frequency, and at a working voltage or a small overvoltage.

It is impractical to conduct this test for long length of high voltage power cable using a portable test voltage source. As a result, tests on installed power cable circuits are often conducted by connecting the circuit to be tested to the electrical power cable system and monitoring its performance for a period of time. Upon satisfactory completion of the monitoring period, the circuit is then placed into commercial service.

Power cable systems are sometimes installed without built-in PD measurement sensors in the accessories. If a PD measurement test is to be conducted on such a circuit, it is necessary to provide PD measurement sensors for sensing PD signals. Usually, the PD measurement sensors are releasably connected to the service links. With reference to FIG. 1, a partial discharge sensor 2 is releasably disposed about a service link 4. The service link 4 is attached to an accessory 6 in a form of a termination. The accessory 6 includes a first accessory component 8, a second accessory component 10 and a sleeve 12 which connects the first accessory component 8 and the second accessory component 10 to each other. Each of the first and second accessory components 8 and 10 has a lug 14. Opposing ends of the service link 4 are respectively connected to the lugs 14 by fasteners 15 such as screws or bolts. By way of example only, the first accessory component 8 is connected to switchgear 16 while a high-voltage cable 18 is connected to the second accessory component 10.

The service link 4 is required to be added to the accessory when the power cable system is in service in order to control voltages occurring on the power cable sheath by allowing flow of induced power frequency and transient currents. The service link 4 can be fitted in a variety of configurations to control the magnitude of the flowing current. As illustrated in FIG. 1, the service link 4 is fitted directly to the accessory 6. Also, service links can be used at remote enclosures, such as link boxes or link kiosks, which are normally located within a few meters of the accessories.

Many hazards are associated with energized power cable systems. One hazard is standing power frequency voltages that exist between service links and from service links to earth which arises from normal operation of the power cable system. Another hazard is transient voltages that exist between service links and from service links to earth which arises from switching operations, lightning strikes and the like. Yet another hazard is severe electrical arcing as a result of flashover involving the service links. Thus, there are three major considerations of safety regarding testing of energized power cable systems. One, conducting partial discharge tests on an energized power cable system should pose no risk of injury to living beings. Two, there should be no added risks of damage to the circuit being tested or equipment associated with the tests. Three, faults are likely to occur within the first few hours of the operation of the power cable system when PD testing is likely to be in progress.

SUMMARY

It is an object of the invention to provide a partial discharge detection test link having built-in partial discharge sensor.

Another object of the invention is to provide a partial discharge detection system and methods for minimizing risks of injury to living beings as well as risk of damage to the power cable circuit while being tested.

Yet another object of the invention is to provide a partial discharge detection system and methods that electrically isolate the circuit being tested and measuring instruments.

Still yet another object of the invention is to provide a partial discharge detection system and methods that do not require touching of any electrical signal leads or other electrical connections while the circuit is being tested.

Accordingly, a partial discharge detection test link of the invention, a partial discharge detection system and methods of the invention for detecting partial discharge are hereinafter described. The partial discharge detection test link of the invention detects partial discharge of a power cable at a power cable accessory that includes a first accessory component and a second accessory component connected to each other. The partial discharge detection test link of the invention includes a conductor and a partial discharge sensor. The conductor member includes an electrically conductive element and an insulation surrounding and extending along the electrically conductive element. The electrically conductive element has a pair of opposite ends. A respective one of the ends is adapted for electrical connection to a respective one of the first and second accessory components. The partial discharge sensor is disposed about the conductor member. The partial discharge sensor has primary winding and a secondary winding with the insulation positioned between the primary winding and the secondary winding.

The partial discharge detection system includes the conductor member and a partial discharge sensor similar to the one described above. The partial discharge detection system of the invention also includes a first converter device, a second converter device and a partial discharge measuring instrument. The partial discharge sensor is operative to detect partial discharge of the power cable as partial discharge electrical signals. The first converter device, electrically connected to partial discharge sensor, is operative for receiving the partial discharge electrical signals from the partial discharge sensor and converting the partial discharge electrical signals to alternative energy signals representative of the partial discharge electrical signals. The second converter device in communication with the first converter device is operative for receiving the alternative energy signals and converting the alternate alternative energy signals to electrical output signals representative of the alternative energy signals. The partial discharge measuring instrument which is coupled to the second converter device is operative to read the electrical output signals and measure the partial discharge from the power cable.

One method of the invention detects partial discharge on an energized power cable. The method of the invention includes the steps of detecting partial discharge of the energized power cable at or adjacent to the energized power cable by generating partial discharge electrical signals representative of the detective partial discharge; converting the partial discharge electrical signals to alternative energy signals representative of the partial discharge electrical signals adjacent to the power cable; transmitting the alternative energy signals to a location remote from the energized power cable; and, interpreting the alternative energy signals in a manner to measure the partial discharge of the energized power cable.

Another method detects partial discharge on the energized power cable. The method includes the steps of connecting the first accessory component and the second accessory component together using the test link; detecting the partial discharge of the energized power cable at the test link by generating partial discharge electrical signals; and, interpreting the partial discharge electrical signals in a manner to measure the partial discharge of the energized power cable.

Yet another method of the invention detects partial discharge on a plurality of energized power cables positioned in an enclosure defined by an arrangement of walls. The method includes the steps of connecting respected ones of the first accessory components and the second accessory components to each other using a plurality of electrically insulative connectors; directly electrically connecting the respective ones of the first accessory components and the second accessory components to each other using respective ones of the plurality of test links; positioning electrically insulative barriers between juxtaposed ones of the plurality of energized cables to inhibit flashover; detecting partial discharge of the plurality of energized power cables at respective test links by generating partial discharge electrical signals; converting the partial discharge electrical signals adjacent the enclosure to alternative energy signals; transmitting the alternative energy signals to a location remote from the enclosure; and, interpreting the alternative energy signals at the remote location in a manner to measure the partial discharge of the respective energized power cables.

Other objects and advantages of the invention will become apparent from the following description of the embodiments taken in conjunction with the accompanying drawings.

BRIEF DESCRIPTION OF THE DRAWINGS

FIG. 1 is a side elevational view of an exemplary accessory having a first accessory component and a second accessory component interconnected by a conventional service link with a conventional partial discharge sensor partially disposed about the service link;

FIG. 2 is a side elevational view of a first embodiment of a partial discharge detection test link of the invention connected to the exemplary accessory;

FIG. 3 is a side elevational view of the partial discharge detection test link of the invention;

FIG. 4 is an enlarged elevational view in cross-section of the partial discharge detection test link taken along line 4—4 in FIG. 3;

FIG. 5 is a side elevational view of a second embodiment of the partial discharge detection test link of the invention that includes a current transformer;

DESCRIPTION OF THE EMBODIMENTS

Figure 6:
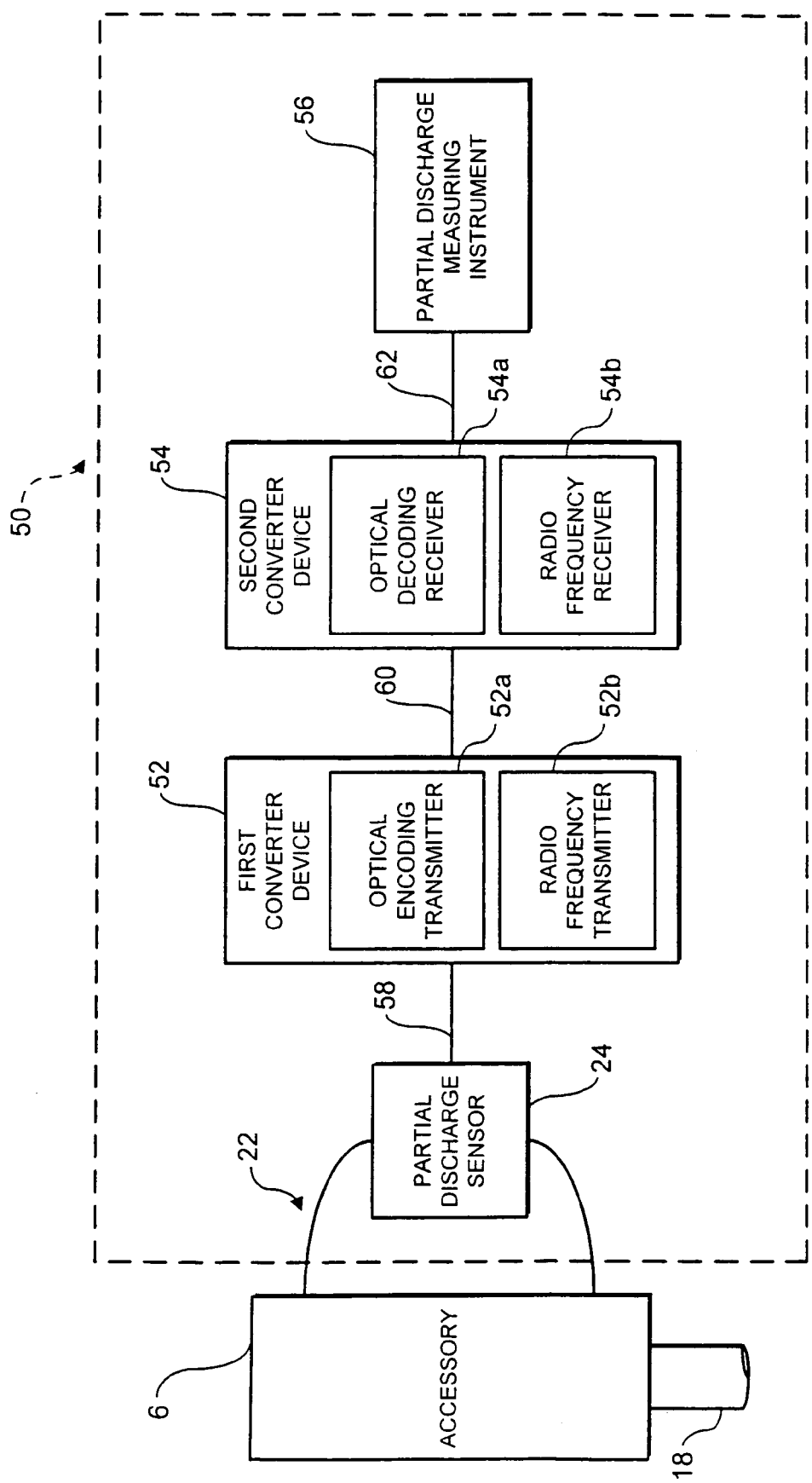
FIG. 6 is a diagrammatical view of a partial discharge detection system of the invention.

A partial discharge test link 20 of the invention is generally introduced in FIGS. 2–4. It is noted that identical elements designated FIG. 1 are identified with the same referenced numerals in FIG. 2. The partial discharge detection test link 20 of the invention detects partial discharge of the high voltage cable 18 at the power cable accessory 6. As shown in FIG. 3, the partial discharge detection test link 20 of the invention includes a conductor member 22 and a partial discharge sensor 24. The conductor member 22 includes an electrically conductive element 26 and an insulation 28 that surrounds and extends along the electrically conductive element 26. The electrically conductive element 26 has a pair of opposite ends 30. As shown in FIG. 2, a respective one of the ends 30 is adaptive for electrical connection to a respective one of the first and second accessory components 8 and 10 as is known in the art and illustrated in FIG. 1. As shown by way of example only, in FIG. 2, the power cable accessory 6 is a cable termination, also known as a cable terminal. As illustrated in FIG. 2, the conductor member 22 is connected directly across the power cable accessory 6. This direct connection, particularly for purposes of testing the circuit, allows the freest flow of any possible fault currents through the partial discharge detection test link 20 of the invention. Furthermore, this direct connection provides the optimum lowest-impedance path for power frequency and transient occurrence flowing along the power cable.

With reference to FIGS. 2 and 3, the partial discharge detection test link 20 of the invention also includes an electrically conductive cable lead 36 that extends from and is operably connected to the partial discharge sensor 24. Although not by way of limitation, the cable lead 36 has a cable terminal 38. Also, the partial discharge detection test link 20 of the invention may also include a ground cable 40 that is electrically connected to the electrically conductive element 26.

In FIG. 3, the pair of opposite ends 30 project from the insulation 28. An electrically conductive connector 42 in a form of an eyelet comprises each opposite end 30. The electrically conductive connectors 42 facilitate ease in fastening the partial discharge connection test link 20 to the accessory 6 by the fasteners 15.

Preferably, the electrically conductive element 26 is fabricated from a flexible cable material such as copper wire. However, one of ordinary skill in the art would appreciate that a rigid material that is electrically conductive would also be suitable to practice the invention. Preferably, the electrically conducted element 26 is a bonding lead.

Although, not by way of limitation, the partial discharge sensor 24 is a radio frequency current transformer. The radio frequency current transformer can be either a ferrite-cored construction, an air-cored construction or a rogowski-coil construction. It is further preferred that the partial discharge sensor 24 is an isolation-type radio frequency current transformer. The radio frequency current transformer is operative to sense electromagnetic pulses emanating at a rapid rate from the energized power cable. The isolation type radio frequency current transformer is optimized to yield high sensitivity to the electromagnetic pulses emanating at this rapid rate. Simultaneously, the conductor member 22 is designed to tolerate substantial power frequency currents flowing through the electrically conductive element 26.

In FIG. 4, the secondary winding 34 of the partial discharge sensor 24 is illustrated as being electrically isolated from the electrically conductive element 26 by virtue of an insulation 28 being disposed therebetween. The insulation 28 has a thickness "t" and the electrically conductive element 26 has a diameter "d". It is preferred that the thickness "t" of the insulation 28 is at least one half of the diameter "d" of the electrically conductive element 26.

An alternative embodiment of a partial discharge detection test link 120 is depicted in FIG. 5. The partial discharge detection test link 120 of the invention includes identical elements of the partial discharge detection test link described above. Additionally, the partial discharge detection test link 120 includes a current transformer 44 which is disposed about the conductor member 22. The current transformer 44 is operative to sense power frequency flowing in the conductor member 22. A current transformer lead 46 is electrically connected to the current transformer 44 at one end and includes a current transformer terminal 48 at the opposite end.

Figure 7:
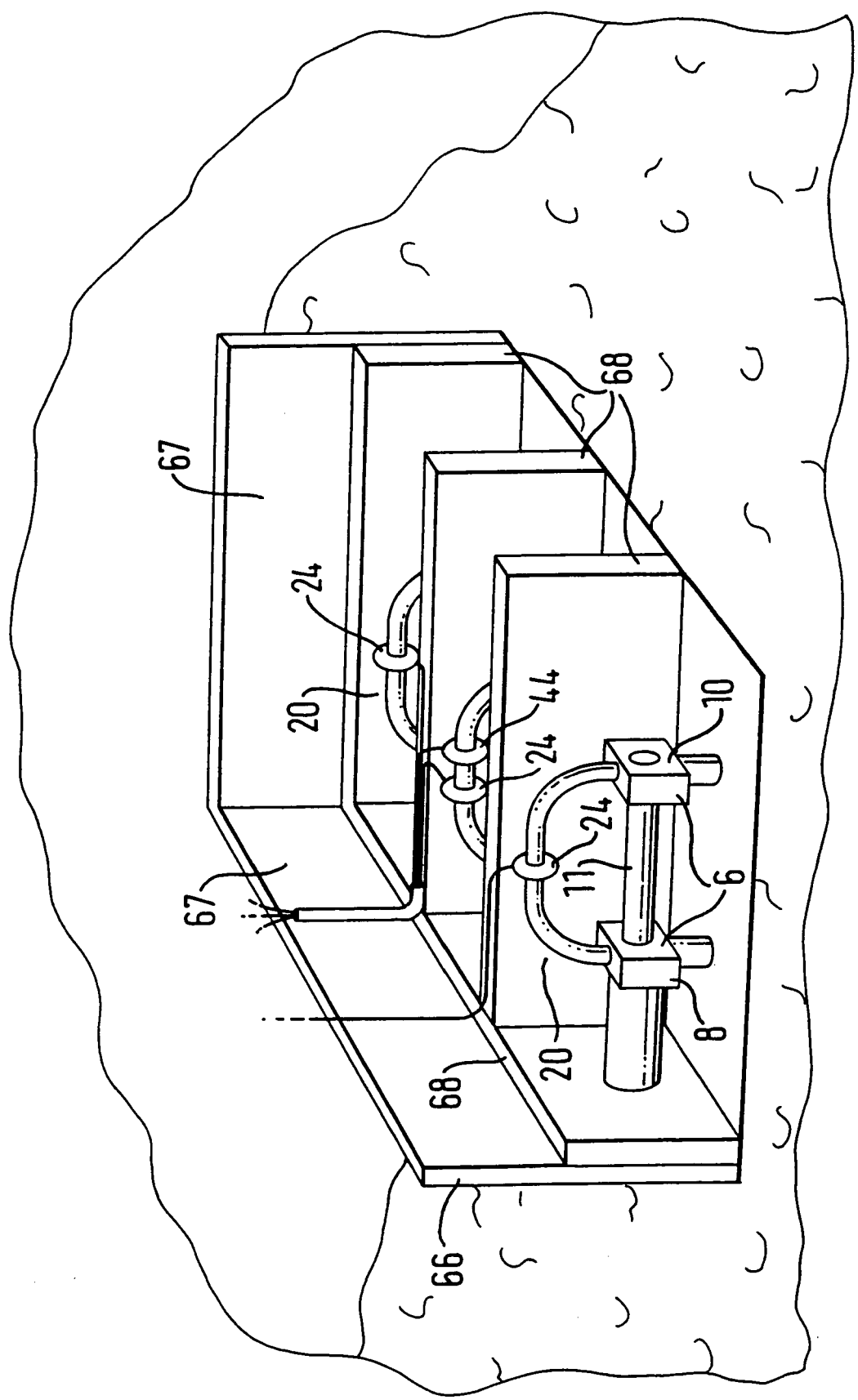
FIG. 7 is a perspective view of a plurality of partial discharge detection test links with each connected to an alternative exemplary accessory disposed in a link box.
Figure 8:
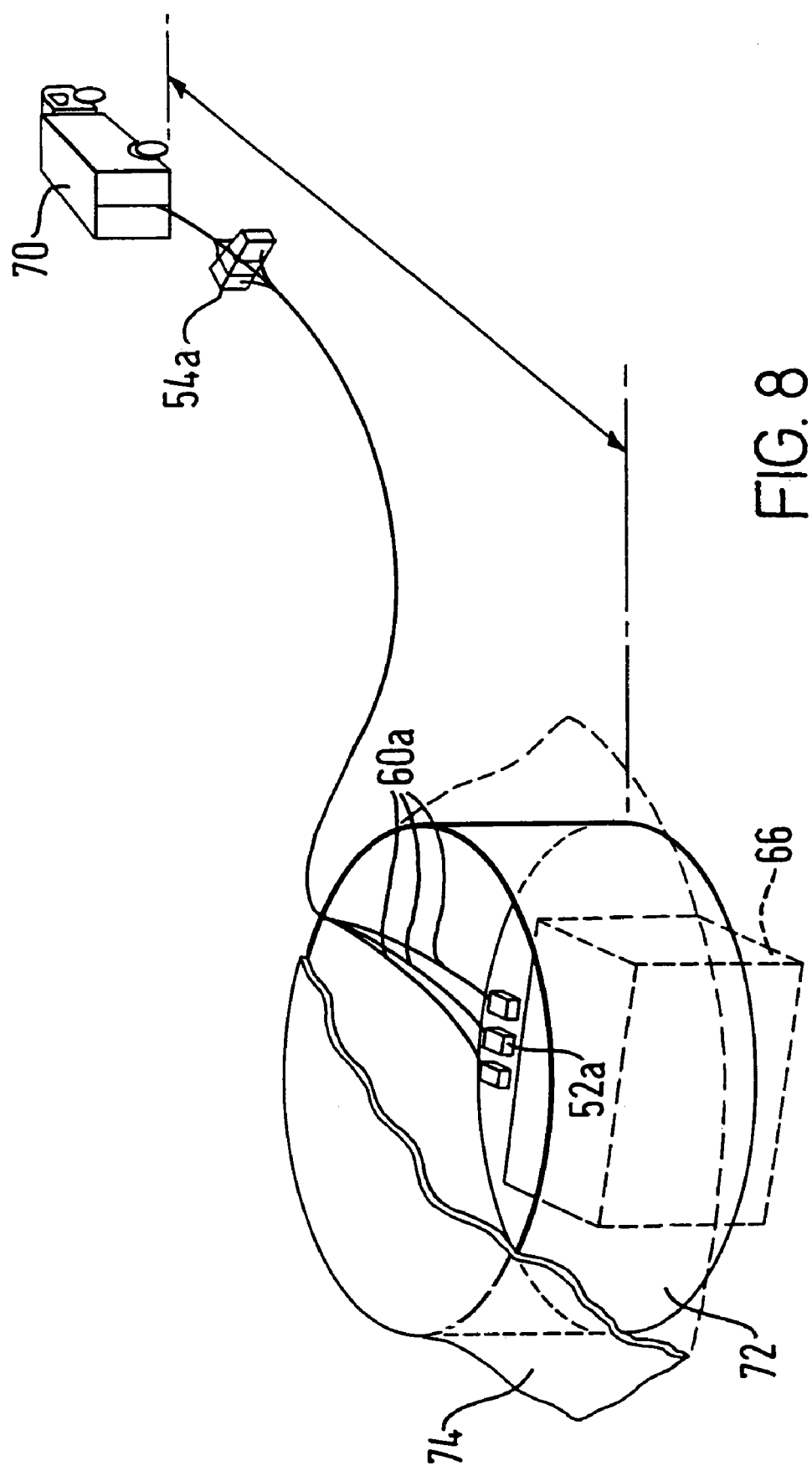
FIG. 8 is a perspective view illustrating a partial arrangement of the partial discharge detection system disposed above the link box in FIG. 7; and, FIG. 9 is flowchart of a method for detecting partial discharge on an energized power cable.

A partial discharge detection system 50 of the invention is generally introduced in FIGS. 6–8. The partial discharge detection system 50 includes the conductor member 22, the partial discharge sensor 24, a first converter device 52, a second converter device 54 and a partial discharge measuring instrument 56. The partial discharge sensor 24 is operative to detect partial discharge of the energized power cable as partial discharge electrical signals. The first converter device 52 is electrically connected to the partial discharge sensor 24 as represented by line 58. The first converter device 52 is operative for receiving the partial discharge electrical signals from the partial discharge sensor 24. Also, the first converter device 52 is operative for converting the partial discharge electrical signals to alternative energy signals which are representative of the partial discharge electrical signals.

The second converter device 54 communicates with the first converter device 52 as represented by line 60. The second converter device 54 is operative for receiving the alternative energy signals and converting the alternative energy signals to electrical output signals representative of the alternative energy signals. The partial discharge measuring instrument 56 is coupled to the second converter device 54 as represented by line 62. The partial discharge measuring instrument 56 reads the electrical output signals and measures the partial discharge from the power cable 18.

Preferably, the alternative energy signals are optical signals. However, one of ordinary skill in the art would appreciate that the alternative energy signals can be radio frequency signals or other such signals commonly used throughout the electromagnetic spectrum. If the alternative energy signals are optical signals, the first converter device 52 is preferably an optical encoding transmitter 52a and the second converter device 54 is preferably an optical decoding receiver 54a. If the alternative energy signals are radio frequency signals, the first converter device 52 is preferably a radio frequency transmitter 52b and the second converter device 54 is preferably a radio frequency receiver 54b.

As shown in FIG. 7, an alternative partial discharge detection test link 120 is used thus providing the current transformer 44 for sensing power frequency current flowing in the conductor member 22 shown best in FIG. 5. The current transformer 120 generates a power frequency current signal used in conjunction with the partial discharge measuring instrument 56 for synchronizing the partial discharge measuring instrument 56 with voltage frequency and voltage phase of a voltage in the power cable when the power cable is energized.

With reference to FIGS. 7 and 8, the partial discharge detection test link and the partial discharge detection system are illustrated by way of example only. Note, in FIG. 7, the accessory 6 is in a form different than the one described above. By way of example, the accessory 6 is a pair of bonding lead clamps with the first accessory component 8 being one bonding lead clamp and the second accessory component 10 being a remaining one of the pair of bonding lead clamps. The pair of bonding lead clamps are connected together by a bonding lead 11. Thus, the invention is adaptable to other types of accessories regardless of their form and is not limited to the ones described herein.

A plurality of partial discharge detection test links 20 and 120 are disposed in an enclosure 66 in a form of a buried link box. One of ordinary skill in the art would appreciate that an above-ground kiosk is another example of the enclosure 66. Insulating barriers 68 are installed between the partial discharge detection test links within the enclosure 66 and between the partial discharge test links and walls 67 of the enclosure 66 to reduce risks associated with flashover. Outputs from the plurality of the partial discharge sensors 24 and the current transformer 44 at each accessory position are connected to the optical encoding transmitters 52a shown in FIG. 8. The optical signals from the optical encoding transmitters 52a are transmitted to and decoded at corresponding optical decoding receivers 54a which are positioned at a safe distance from the enclosure 66. Using optical transmission provides electrical isolation between the circuit being tested and the partial discharge measuring instruments 56 as well as personnel. Thus, it is not necessary for anyone to touch any of the electrical signal leads or any other electrical connections while the circuit is undergoing testing. When tests have to be made at several accessory positions during a single period of energization of the circuit being tested, it is only necessary to connect optical fiber leads 60a from the optical encoding transmitters 52a to the optical decoding receivers 54a. The optical encoding receivers 54a as well as the partial discharge measuring instruments may be housed and transported in a vehicle 70 which might be equipped with a generator to provide power.

In FIG. 8, a concrete barricade 72 surrounds the buried enclosure 66 and is positioned on an earthened surface. The concrete barricade 72 provides protection to personnel testing the circuit and equipment. The concrete barricade 72 may be covered by a heavy sheet material 74 such as a tarpaulin to prevent rain, birds or other foreign objects from entering the enclosure 66. Thus, with reference to FIGS. 7 and 8, partial discharge on a plurality of energized power cables is detected. Each energized power cable is interconnected by the accessory which has the first accessory component and the second accessory component releasably connectable to each other. Although not by way of limitation, the plurality of energized power cables are disposed apart from one another in a juxtaposed relationship and are positioned in the enclosure that is defined by an arrangement of the walls. Electrically insulative barriers, a plurality of electrically insulative connectors and a plurality of test links are provided.

Respective ones of the first and second accessory components are directly electrically connected to each other using respective ones of a plurality of test links. In this manner, direct electrical communication is provided between the respective ones of the connected first and second accessory components. The electrically insulative barriers are positioned between juxtaposed ones of the plurality of energized power cables. The electrically insulative barriers are also placed between the energized power cables and the walls of the enclosure to further inhibit flashover. Such positioning of the electrically insulative barriers inhibits flashover. Partial discharge of the plurality of energized power cables is detected at the respective test links. As discussed above, partial discharge detection is achieved by generating partial discharge electrical signals representative of the detected partial discharge of the respective energized power cables. The partial discharge electrical signals are converted adjacent the enclosure to alternative energy signals that are representative of the partial discharge electrical signals. The alternative energy signals are then transmitted to a location remote from the enclosure. At the remote location, the alternative energy signals are interpreted by instruments to measure the partial discharge of the respective energized power cables.

The partial discharge detection test links may be left permanently in position to allow continuous or intermittent monitoring of the energized power cable for partial discharge while in service. Alternatively, the partial discharge detection test links may be removed after testing and replaced with the conventional service links.

Figure 9:
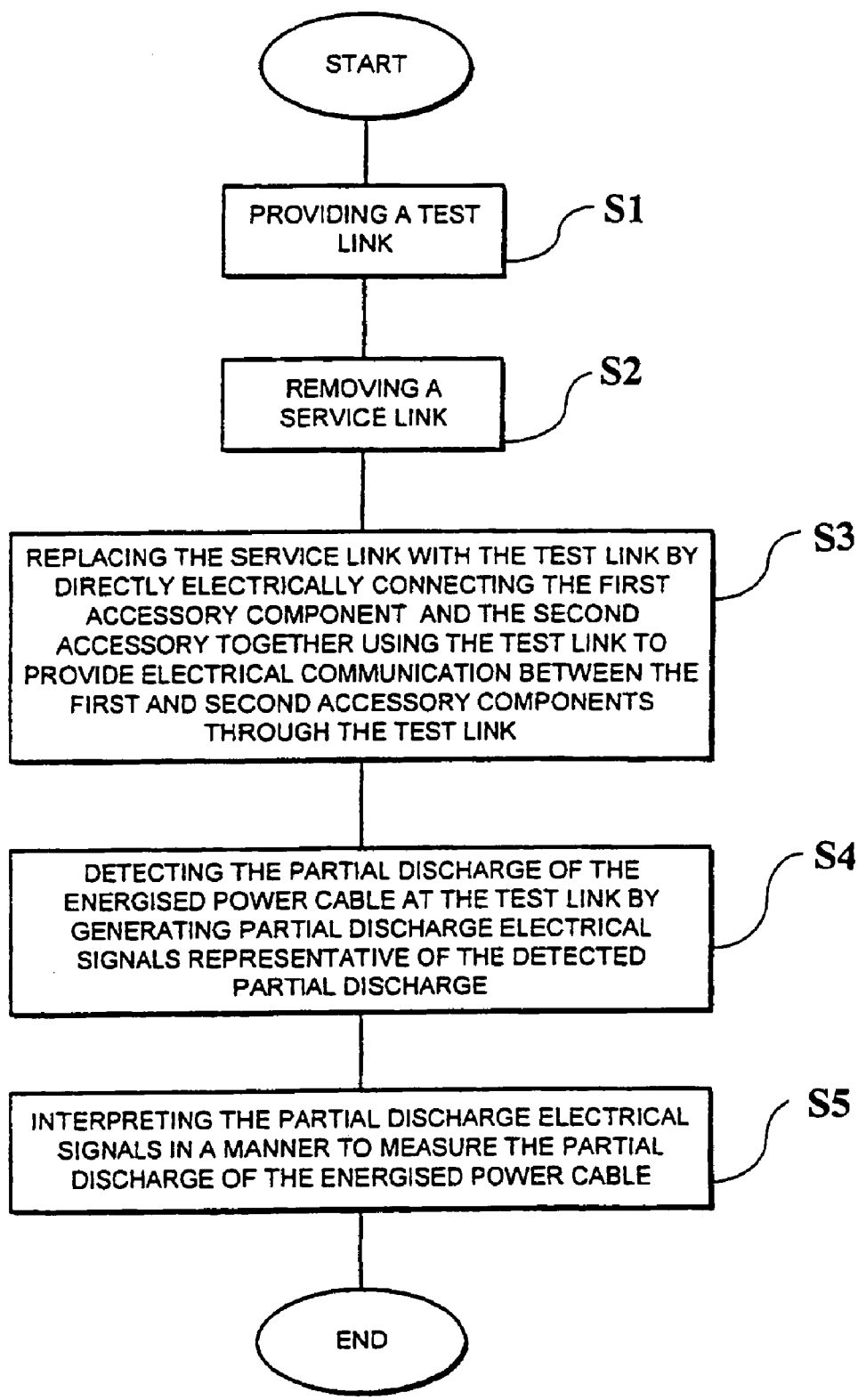

A method of the invention for detecting partial discharge on an energized power cable is introduced in FIG. 9. The energized power cable has an accessory that is interposed therein. The accessory includes a first accessory component and a second accessory component that are coupled to each other and are connected by a service link. In FIG. 9, step S1 provides a test link. Step S2 removes the service link. Step S3 replaces the service link with the test link by directly electrically connecting the first accessory component and the second accessory component together using the test link. Thus, electrical communication is provided between the first and second accessory components through the test link. Step S4 detects the partial discharge of the energized power cable at the test link by generating partial discharge electrical signals representative of the detected partial discharge. Step S5 interprets the partial discharge electrical signals in a manner to measure the partial discharge of the energized power cable. An additional step might be detecting power frequency current of the energized power cable at the test link as frequency current signals. Additionally, another step might be synchronizing the measured partial discharge of the energized power cable with voltage frequency and voltage phase of voltage in the energized power cable determined from the step of detecting power frequency current of the energized power cable.

Although the embodiments of the invention have been specifically described herein, it would be apparent to those skilled in the art to which the invention pertains that other variations and modifications of the embodiments herein may be made without departing from the spirit and scope of the invention.

What is claimed is:

1. A partial discharge detection test link for detecting partial discharge of a power cable at a power cable accessory including a first accessory component and a second accessory component connected to each other, the partial discharge detection test link comprising:
   a conductor member including an electrically conductive element and an insulation surrounding and extending along the electrically conductive element, the electrically conductive element having a pair of opposite ends with a respective one of ends adapted for electrical connection to a respective one of the first and second accessory components; and
   a partial discharge sensor disposed about the conductor member, the partial discharge sensor having a primary winding in a form of the electrically conductive element and a secondary winding with the insulation positioned between the primary winding and the secondary winding.

2. A partial discharge detection test link according to claim 1, further comprising an electrically conductive cable lead operably connected to and extending from the partial discharge sensor.

3. A partial discharge detection test link according to claim 1, wherein at least one end projects from the insulation.

4. A partial discharge detection test link according to claim 3, wherein at least one end includes an electrically conductive connector.

5. A partial discharge detection test link according to claim 1, wherein the electrically conductive element is fabricated from a flexible cable material.

6. A partial discharge detection test link according to claim 1, wherein the electrically conductive element is a bonding lead.

7. A partial discharge detection test link according to claim 1, wherein the partial discharge sensor is a radio frequency current transformer.

8. A partial discharge detection test link according to claim 7, wherein the radio frequency current transformer is one of a ferrite-cored construction, an air-cored construction and a rogowski-coil construction.

9. A partial discharge detection test link according to claim 7, wherein the radio frequency current transformer is an isolation type.

10. A partial discharge detection test link according to claim 7, wherein the radio frequency current transformer is operative to sense electromagnetic pulses emanating at a rapid rate from the power cable while the conductor member tolerates substantial power frequency currents flowing through the electrically conductive element.

11. A partial discharge detection test link according to claim 10, wherein the radio frequency current transformer is optimized to yield high sensitivity to the electromagnetic pulses emanating at the rapid rate.

12. A partial discharge detection test link according to claim 1, wherein the secondary winding is electrically isolated from the electrically conductive element.

13. A partial discharge detection test link according to claim 1, wherein the partial discharge sensor is connected to the conductor member.

14. A partial discharge detection test link according to claim 1, further comprising a current transformer disposed about the conductor member and operative to sense power frequency flowing in the conductor member.

15. A partial discharge detection test link according to claim 14, wherein the current transformer is connected to the conductor member.

16. A partial discharge detection test link according to claim 1, wherein the conductor member is connected directly across the accessory.

17. A partial discharge detection test link according to claim 1, wherein the insulation has a thickness and the electrically conductive element has a diameter whereby the thickness of the insulation is at least one half of the diameter of the electrically conductive element.

18. A partial discharge detection test link according to claim 1, wherein the power cable accessory is one of a cable termination and a pair of bonding lead clamps.

19. A partial discharge detection test link according to claim 1, further comprising a ground cable electrically connected to the electrically conductive element.

20. A partial discharge detection test link according to claim 1, further comprising an electrically insulative connector element sized and adapted to connect the first accessory component and the second accessory component together while electrically insulating the first accessory component and the second accessory component from one another.

21. A partial discharge detection system for detecting partial discharge of a power cable at a power cable accessory including a first accessory component and a second accessory component connected to each other, the partial discharge detection system comprising:
 a conductor member including an electrically conductive element and an insulation surrounding and extending along the electrically conductive element, the electrically conductive element having a pair of opposite ends with a respective one of ends adapted for electrical connection to a respective one of the first and second accessory components;
 a partial discharge sensor disposed about the conductor member and operative to detect the partial discharge of the power cable as partial discharge electrical signals;
 a first converter device electrically connected to the partial discharge sensor and operative for receiving the partial discharge electrical signals from the partial discharge sensor and converting the partial discharge electrical signals to alternative energy signals representative of the partial discharge electrical signals;
 a second converter device in communication with the first converter device and operative for receiving the alternative energy signals and converting the alternative energy signals to electrical output signals representative of the alternative energy signals; and
 a partial discharge measuring instrument coupled to the second converter device and operative to read the electrical output signals and measure the partial discharge from the power cable.

22. A partial discharge detection system according to claim 21, wherein the alternative energy signals are one of optical signals and radio frequency signals.

23. A partial discharge detection system according to claim 22, wherein when the alternative energy signals are optical signals, the first converter device is an optical encoding transmitter and the second converter device is an optical decoding receiver and when the alternative energy signals are radio frequency signals, the first converter device is a radio frequency transmitter and the second converter device is a radio frequency receiver.

24. A partial discharge detection system according to claim 21, further comprising a current transformer disposed about the conductor member and operative to sense power frequency current flowing in the conductor member.

25. A partial discharge detection system according to claim 24, wherein the current transformer generates a power frequency current signal used in conjunction with the partial discharge measuring instrument for synchronizing the partial discharge measuring instrument with voltage frequency and voltage phase of voltage in the power cable when energized.

26. A partial discharge detection system according to claim 21, further comprising an electrically insulative connector element sized and adapted to connect the first accessory component and the second accessory component together while electrically insulating the first accessory component and the second accessory component from one another.

* * * * *